United States Patent [19]

Marsh

[11] Patent Number: 6,143,667
[45] Date of Patent: Nov. 7, 2000

[54] METHOD AND APPARATUS FOR USING PHOTOEMISSION TO DETERMINE THE ENDPOINT OF AN ETCH PROCESS

[75] Inventor: Eugene P. Marsh, Boise, Id.

[73] Assignee: Micron Technology, Inc., Boise, Id.

[21] Appl. No.: 09/340,985

[22] Filed: Jun. 28, 1999

[51] Int. Cl.$^7$ .................................................. H01L 21/302

[52] U.S. Cl. .............................. 438/740; 438/16; 438/17; 438/720; 438/722; 438/723; 216/84; 216/85; 216/86; 216/72

[58] Field of Search ................................. 216/84, 85, 86, 216/72; 438/16, 17, 18, 722, 723, 720, 740

[56] References Cited

U.S. PATENT DOCUMENTS

| | | | |
|---|---|---|---|
| 4,846,920 | 7/1989 | Keller et al. | 156/345 |
| 4,902,631 | 2/1990 | Downey et al. | 437/7 |
| 5,591,986 | 1/1997 | Niigaki et al. | 257/10 |
| 5,658,423 | 8/1997 | Angell et al. | 438/9 |
| 5,989,928 | 11/1999 | Nakata et al. | 438/7 |

FOREIGN PATENT DOCUMENTS 2-090613  3/1990  Japan .

OTHER PUBLICATIONS

"Plasma–Enhanced Photoemission Detection: A New Method For Real Time Surface Monitoring During Plasma Processing", Selwyn et al., IEEE Journal of Quantum Electronics; vol. 25, No. 5, 5–89; pp. 1093–1103.

*Primary Examiner*—William Powell
*Assistant Examiner*—George Goudreau
*Attorney, Agent, or Firm*—Winstead Sechrist & Minick P.C.; Hugh R. Kress

[57] ABSTRACT

A method and apparatus for using photoemission to determine the endpoint of a dry etch process. In one embodiment, the endpoint of a dry etch process is determined when the dry etch process is acting on a substrate comprising a layer of a first material overlying a second material. The substrate is illuminated with a beam of monochromatic light. The photon energy of the monochromatic light is greater than the work function of one of the two materials, and less than the work function of the other material. Thus the beam of light is capable of inducing photoemission of electrons in only one of the two materials: the material with a work function less than the photon energy of the beam of light. The electrons emitted by the photoemitting so material are collected. The current generated by the collected stream of electrons, the photocurrent, is amplified. A time-series of amplified photocurrent measurements is monitored for changes that correspond to the endpoint of the dry etch process.

23 Claims, 5 Drawing Sheets

METHOD AND APPARATUS FOR USING PHOTOEMISSION TO DETERMINE THE ENDPOINT OF AN ETCH PROCESS

FIELD OF THE INVENTION

This invention relates generally to dry etching as practiced in the manufacture of solid state electronic devices and more particularly, to detecting the endpoint of a dry etching process.

BACKGROUND

Dry etching is an important step in the manufacture of solid state electronic devices. Dry etching is a generic term that encompasses etching techniques in which gases, as opposed to liquid chemicals, are the primary etch medium. Examples of dry etching techniques used in the manufacture of solid state electronic devices are ion beam milling, plasma etching, and reactive ion etching ("RIE").

In the manufacture of solid state electronic devices, dry etching is frequently employed to remove a layer of one material in order to expose an underlying layer of another material. For example, dry etching processes are often employed to etch openings in a layer of insulating material in order to expose an underlying layer of conductive material. The desired endpoint of a dry etch process occurs when the layer being etched is completely removed. Unfortunately, layers subjected to an etching process are not always uniformly removed. Across the area of the layer being etched, the etch rate and the thickness of the layer may vary. Because of these variations, it will take longer to completely remove some regions of the layer than others. To completely remove the entire film, etching will typically have to continue even after some other regions of the layer have already been completely removed. The common practice of exposing a layer to an etching process for longer than is necessary to etch through one region of the layer is referred to as overetching. In the manufacture of solid state electronic devices, a layer being removed by a dry etching process must be overetched to ensure that the entire layer is removed. Overetching causes a certain amount of the underlying material layer to be also removed in the dry etching process. Due to the shrinking dimensions of solid state electronic devices, it is increasingly important to minimize the amount of this collateral etching by precisely determining the endpoint of a dry etch process.

There are several methods for determining a dry etch process endpoint. A simple method consists of determining the average etch rate of the dry etch process, and then estimating the etch time needed to remove the desired amount of material. The primary disadvantage of using a preset etch time to estimate the endpoint is that there is no way to compensate for run-to-run fluctuations in etch rate. The etch rate may vary between runs because of variations in material properties, film thickness, or processing conditions.

Run-to-run fluctuations can be compensated for by a real-time determination of the endpoint during the course of the etching run. Two well-known, real-time methods of determining the endpoint of a dry etch process are emission spectroscopy and mass spectrometry. Both of these methods involve detecting changes in the concentration of chemical species in the etching chamber. For plasma-etching processes, a third real-time method is available in which the endpoint is determined by monitoring the direct current (DC) bias potential while holding the radio frequency (RF) power constant. Since the voltage/power dependence is related to plasma chemistry, a change in this relationship frequently occurs when the plasma contribution from the layer being etched is no longer present.

Although known real-time endpoint determination methods can compensate for run-to-run variations in etch rate, these methods present a number of potential problems. Sensitivity limitations in known methods require that a minimum amount of material be removed during the etch process. Thus none of these methods can be used if the layer being removed is very thin, or if the percentage of the surface area of the substrate exposed to the etching process is very small. Another potential disadvantage of the three methods is that they tend to average over local non-uniformities within the etching process. In other words, the known methods are incapable of making localized endpoint determinations.

Optical thickness measurement methods, such as ellipsometry and laser reflectometry, can provide real-time localized endpoint determinations. Optical methods involve determining when the endpoint of the process has been reached by measuring the thickness of the film being etched. Unfortunately, these optical methods may be adversely affected by the surface morphology of the layer being etched. Furthermore, the sensitivity of these optical methods decreases when the layer being etched is on the order of a few angstroms thick, because the optical interference effects for such thin layers are quite small.

A real-time localized endpoint detection method based on photoemission offers an alternative to the optical methods. Photoemission occurs when electrons are emitted from the surface of a material by photons with energies greater than the work function $\phi$ of that material. The energy of photons in a monochromatic beam of light is related to the wavelength of the light according to the following relation:

$$E = hc/\lambda$$

where E is the photon energy, typically expressed in electron-Volts (eV), h is Planck's constant, $4.14 \times 10^{-15}$ eV·sec, c is the speed of light, $3.00 \times 10^{17}$ nm/sec, and $\lambda$ is the wavelength of the light, typically expressed in nanometers (nm).

This relationship shows that the shorter the wavelength of light, the higher the photon energy. Since most materials have work functions in excess of around 3 eV, most materials will not photoemit unless they are exposed to a source of ultraviolet, or shorter, wavelength radiation. A photoemitting material produces a stream of electrons referred to as a photocurrent.

Endpoint determination techniques based on photoemission could have a number of advantages over optical endpoint determination methods. Techniques based on photoemission provide real-time, localized measurements of etch rates that are relatively insensitive to surface morphology. In addition, photoemission techniques remain sensitive even when the layer being removed is only a few angstroms thick.

Techniques involving photoemission have been utilized to characterize the steady-state properties of materials. For example, photoemission techniques have been employed to determine the doping levels in semiconductors, and to measure the thickness of contaminant films. These steady-state measurements are intended to produce an absolute value of photocurrent that can be correlated with the value of a physical property, such as thickness. Obtaining an accurate absolute value of photocurrent, however, presents a number of practical difficulties. For example, the absolute value of the photocurrent emanating from a semiconductor material is strongly affected by the presence of adsorbed gases on the surface of the semiconductor, and by photovoltaic currents that are induced in the semiconductor when the photon energy exceeds the band gap energy of the semiconductor. Most of the practical difficulties associated with obtaining an accurate absolute value of photocurrent can be avoided if all that needs to be detected is a change in a series of photocurrent measurements.

SUMMARY OF THE INVENTION

The present invention, in its various embodiments, relates to a method and apparatus for using photoemission to determine the endpoint of a dry etch process. In one embodiment, the method determines the endpoint of a dry etch process when the dry etch process is acting on a substrate comprising a layer of a first material overlying a second material. The method involves illuminating the substrate with a beam of monochromatic light. The photon energy of the monochromatic light is greater than the work function of one of the two materials, and less than the work function of the other material. Thus, the beam of light is capable of inducing photoemission of electrons in only one of the two materials: the material with a work function less than the photon energy of the beam of light. The present invention further involves collecting the electrons emitted by the photoemitting material. The current generated by the collected stream of electrons, i.e., the photocurrent, is amplified. A time-series of amplified photocurrent measurements is monitored for a change known to correspond to the endpoint of the dry etch process.

BRIEF DESCRIPTION OF THE DRAWINGS

The foregoing and other features and aspects of the subject invention may be best understood with reference to a detailed description of a specific embodiment of the invention, which follows, when read in conjunction with the accompanying drawings, in which.

Figure 1:
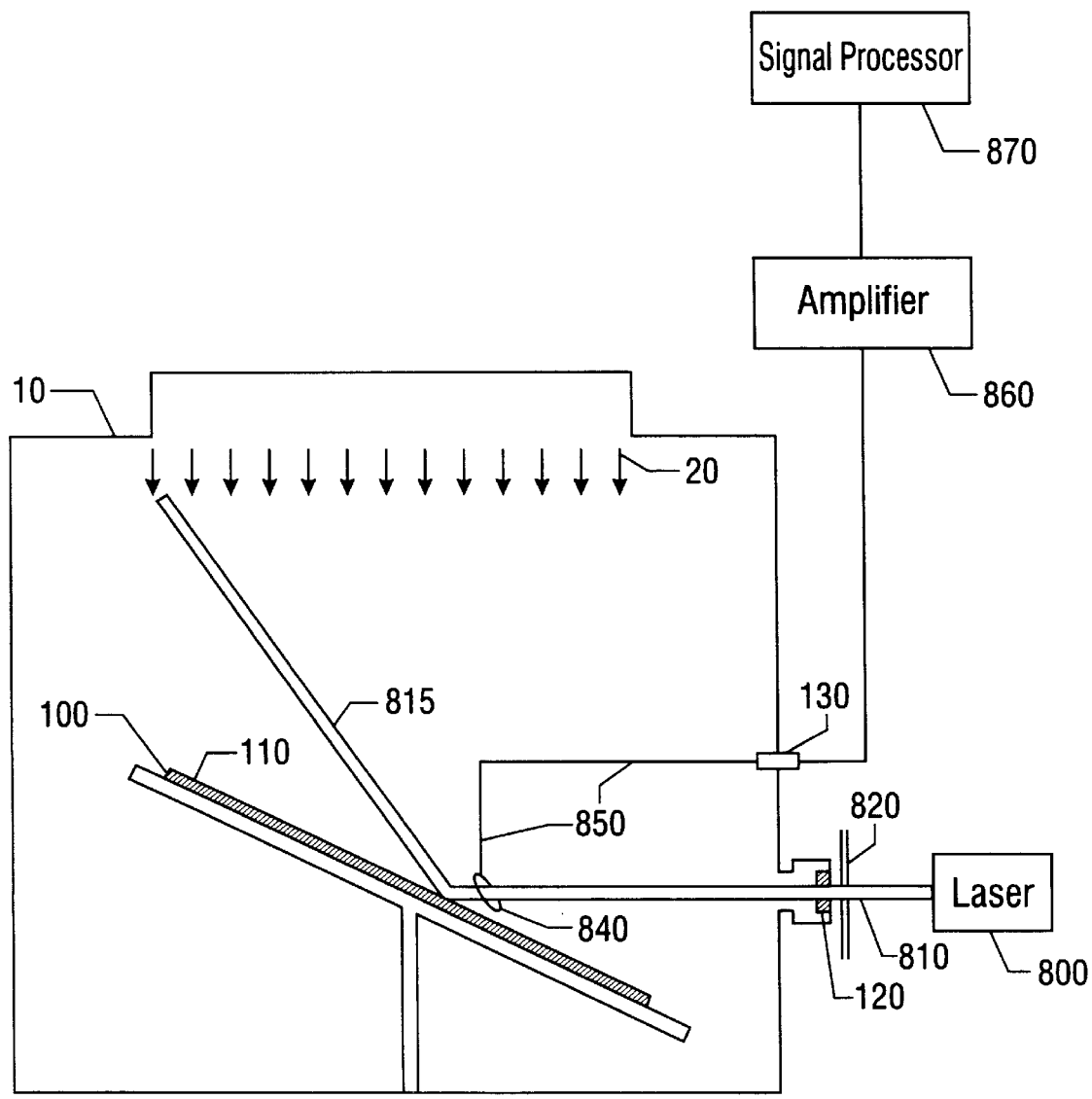
FIG. 1 is a schematic diagram of an implementation of an end point detection method that is in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, to cover all modifications, equivalents, and alternatives falling within the spirit and scope of the invention as defined by the appended claims.

DETAILED DESCRIPTION OF SPECIFIC EMBODIMENTS OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of the present disclosure.

FIG. 1 illustrates an embodiment of the invention, using photoemission to determine the end point of a dry etch process. The embodiment of FIG. 1 is configured to determine the endpoint of the dry etch process carried out within an ion-beam milling apparatus 10. In ion beam milling apparatus 10, etching takes place by bombarding a substrate 100 with a beam 20 of positively charged ions, for example, positively charged argon. The ion beam 20 impinges on one surface 110 of substrate 100, removing material from surface 110 by physically knocking atoms off of surface 110.

Dry etching processes, such as the ion beam milling process represented in FIG. 1, are commonly employed in the manufacture of solid-state electronic devices for the purpose of removing a layer of one material in order to expose an underlying layer of another material. For example, it is common to use a dry etching process to remove a layer of conducting material from an insulating material, or to remove a layer of insulating material from a conductive material. There is a large difference between the work functions of the insulating materials and the conducting materials used in the manufacture of solid state electronic devices. (For the purposes of the present disclosure, the term "conducting material" also encompasses semiconducting materials.) The work function for the conducting material silicon ranges from about 4.6 eV to about 4.9 eV, depending upon which atomic plane is exposed to the incident photons. Conducting materials such as metals also have work functions of less than 5 eV. In contrast to conducting materials such as silicon and metals, insulating materials like polyimides and $SiO_2$ have work functions in excess of 7 eV. Thus a monochromatic light source that provides photons with energies of approximately 5 eV will induce photoemission from a silicon or metal surface, but will not induce photoemission from the surface of an insulating material. A photon energy of 5 eV corresponds to a light wavelength of 248 nm, which is in the ultraviolet region of the electromagnetic spectrum. Since measuring the photocurrent emanating from a surface 110 of a substrate 100 illuminated by a monochromatic beam of 248 nm light provides an effective method of discriminating between a layer of conductive material and a layer of insulating material, measuring the photocurrent also provides a method for determining when a layer of one type of material (conductive or insulating) is completely removed from the other type of material (insulating or conductive). In general, measurements of the photocurrent induced by a monochromatic light source may be used to determine when a layer of a first material is completely removed from a second material whenever there is a difference in work functions between the two materials. Examples of suitable monochromatic light sources are continuous wave lasers, pulsed lasers, and mercury arc lamps (where the light from the arc lamp passes through a monochromatic filter).

Figure 2A:
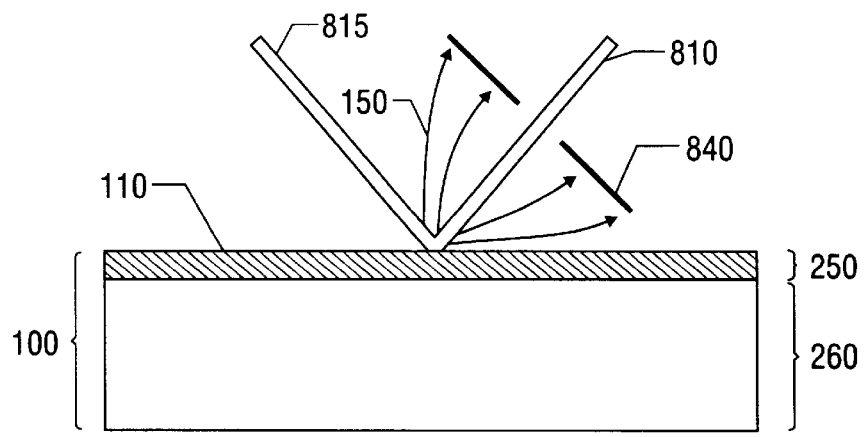
FIG. 2A is a schematic representation of a laser beam illuminating a substrate comprising a continuous layer of a first material that covers a second material.

The embodiment of the invention illustrated in FIG. 1 involves monitoring a series of photocurrent measurements taken during the course of an etching process, to determine when the endpoint of the process has been reached. As shown in FIG. 2A, substrate 100 comprises a layer of a first material 250 overlying a second material 260. Surface 110 of substrate 100, which is covered by layer of a first material 250, is subjected to etching in order to remove that layer 250. For the ion beam milling process in FIG. 1, the etching comprises physical bombardment by positively charged atoms 20. The same surface 110 being etched is illuminated by a laser beam 810. The wavelength of laser beam 810 is chosen so that either first material 250 or second material 260, but not both, photoemit at the wavelength of laser beam 810. In other words, the photon energy corresponding to the laser wavelength must be lower than the work function of one material (so that material won't photoemit), and higher than the work function of the other material (so that material will photoemit).

As previously discussed, if one of the materials 250 or 260 is a conductive material and the other material is an insulating material, a laser wavelength of 248 nm would be suitable. Laser beam 810 impinging on surface 110 of substrate 100 will generally cause the substrate 100 to photoemit. Photoemission might not take place when a layer of non-photoemitting (e.g. insulating) material covers the photoemitting (e.g. conducting) material, and the layer of non-photoemitting material is sufficiently thick to prevent the laser light from reaching the photoemitting material or to prevent the electrons produced by photoemission from reaching the surface. The portion of the substrate surface illuminated by laser beam 810 is shown in more detail in FIG. 2A. FIG. 2A shows substrate 100 comprising a layer of a first material 250 overlying a second material 260. The laser beam 810 generally causes electrons 150 to be emitted from the surface 110 of the substrate 100. The electrons 150 emanate from whichever of the two materials, 250 or 260, has a lower work function $\phi$ than the photon energy of the laser beam 810. The electrons produced by photoemission, photoelectrons, are collected by a collector 840.

Figure 2B:
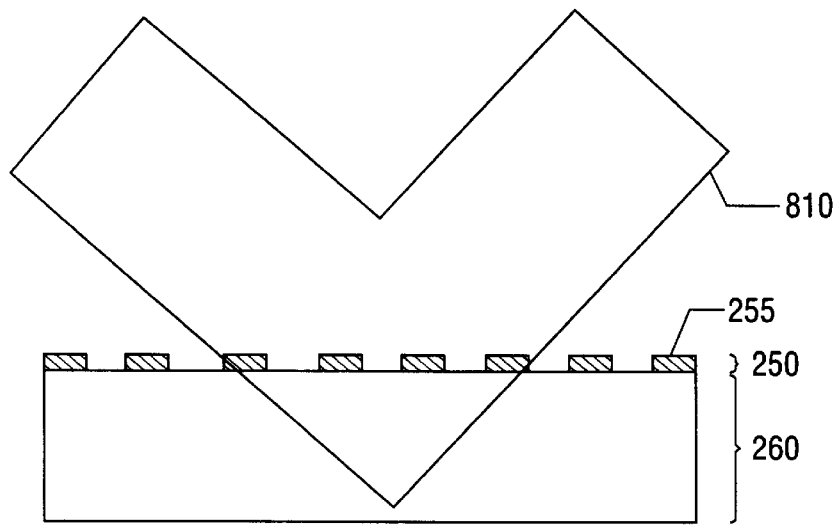
FIG. 2B is a schematic representation of a laser beam illuminating a substrate comprising a discontinuous layer of a first material that partially covers a second material.
Figure 2C:
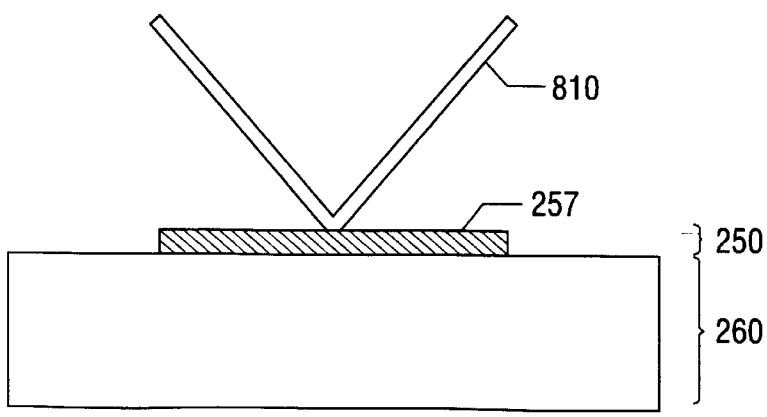
FIG. 2C is a schematic representation of a laser beam illuminating a substrate comprising a continuous layer of a first material that partially covers a second material.

The embodiment in FIG. 1 may be employed even if the layer that is to be removed by the etching process, such as layer 250 in FIG. 2A, does not completely cover the surface 110 of the substrate 100. For example, the present invention may be advantageously practiced if the layer to be removed comprises a number of discontinuous segments, such as is shown in FIGS. 2B and 2C. When a layer comprises a number of discontinuous segments such as those designated with reference numerals 255 in FIG. 2B, it may be desirable to illuminate several segments 255 in order to generate a larger photocurrent. As shown in FIG. 2B, several segments 255 could be illuminated by dispersing laser beam 810 so that it illuminates a wider area. Such dispersion may be effected by directing laser beam 810 through a series of optical elements 820, shown in FIG. 1. Alternatively, it may be desirable in some situations to focus laser beam 810 so that it only illuminates a single segment 255. For example, as shown in FIG. 2C, it may be useful to monitor the removal of material from an individual segment 257. In that situation, it is advantageous to be able to focus laser beam 810 so that it only illuminates the segment 257 of interest. Optics 820 shown in FIG. 1 may be capable of directing, focusing, or dispersing the laser beam 810. In addition to passing through optical elements 820, laser beam 810 passes through a window 120 before entering the interior of the etching chamber 10. Window 120 is preferably transparent to light having the wavelength of laser beam 810.

The magnitude of the flow of photoelectrons to collector 840 may be controlled by applying a bias voltage to collector 840. For example, applying a positive bias voltage to collector 840 will tend to attract the negatively charged electrons, thus increasing the flow of electrons to collector 840. A bias voltage, for example a voltage of approximately +500V, may be applied to collector 840 in the embodiment illustrated in FIG. 1. Such a positive voltage would also tend to repel the positively charged atoms 20, thus minimizing the effect of these ions on the collection of photoelectrons by collector 840.

Any number of collector configurations are compatible with the presently disclosed embodiment of invention. For example, collector 840 could be a metallic ring surrounding incoming laser beam 810. This corresponds to the configuration shown in FIGS. 1 and 2A. In general, collector 840 preferably comprises an electrically conductive surface that is close enough to surface 110 of substrate 100 and large enough to collect an adequate number of photoelectrons. Preferably, the distance between the collector and the substrate 100 remains relatively constant throughout a series of photocurrent measurements. Changing this distance significantly could induce a capacitive current that may interfere with the photocurrent measurements.

The flow of photoelectrons to collector 840 produces a current, the photocurrent. Depending on the light source, the average photocurrent may range from the pico-amp range to the milli-amp range. Pulsed laser light sources may produce instantaneous photocurrents of several amps. As shown in FIG. 1, the photocurrent is carried through a wire 850, which exits the etching chamber through a feed-through 130. The wire leads to an amplifier 860. Amplifier 860 converts the photocurrent, into a signal that is amenable to further processing.

A signal processor 870 receives the output of amplifier 860. The output of amplifier 860 is typically proportional to the photocurrent collected by collector 840. Signal processor 870 either facilitates or performs the function of monitoring a series of amplified photocurrent measurement for a change that corresponds to the specified endpoint of the dry etch process. For example, a signal processor in the form of a strip-chart recorder, or the equivalent, would facilitate the monitoring of the amplified photocurrent measurements by displaying the measurements. Alternatively, the signal processor could be computer programmed to monitor the series of measurements for a change indicative of an endpoint.

Figure 3A:
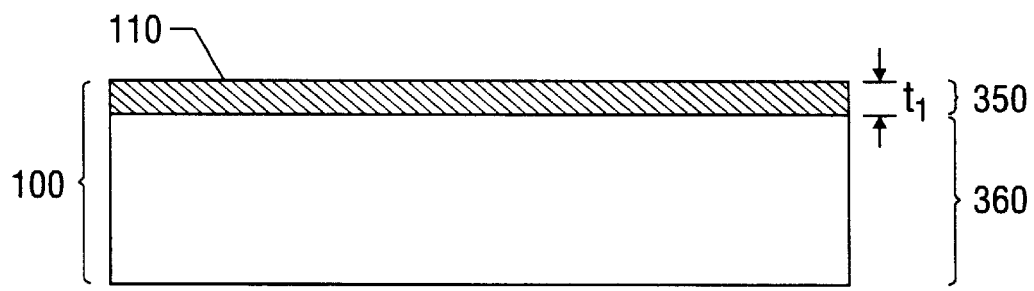
FIGS. 3A, 3B, and 3C are schematic cross-sectional representations of a substrate comprising a layer of insulating material that covers a conductive material at different stages of removal of the layer of insulating material.
Figure 3B:
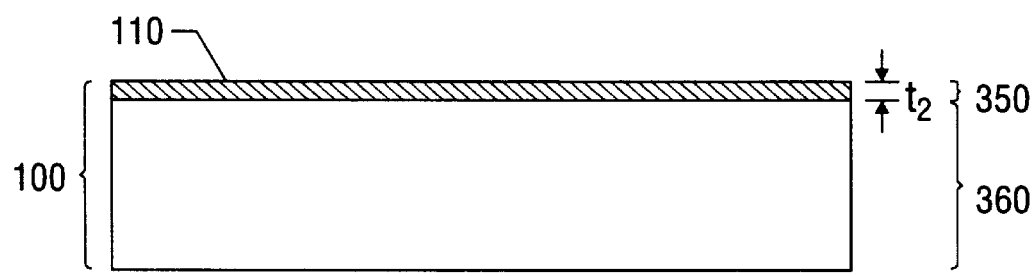
Figure 3C:
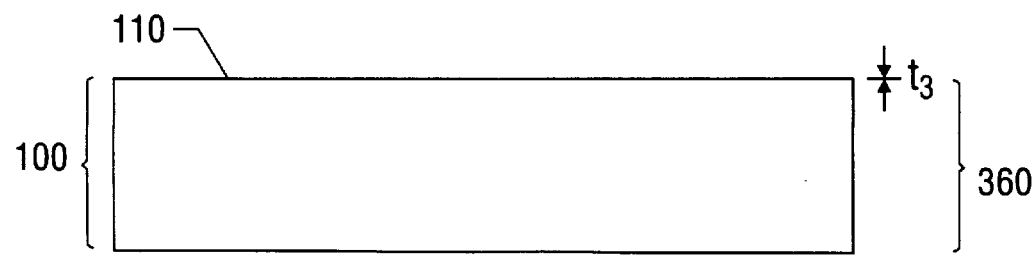

The series of amplified photocurrent measurements to be monitored are gathered during the course of an etching process. FIGS. 3A, 3B, and 3C schematically represent a cross section of a substrate 100 at three successive times in the etching process. The particular substrate 100 shown in FIG. 3A comprises a layer of insulating material 350 overlying a conductive material 360. FIG. 3A shows substrate 100 at the instant the etching process begins. At this point in time, the layer of insulating material 350 has an initial thickness $t_1$. As the etching process progresses, the layer of insulating material 350 is gradually removed. At some later time in the etch, represented in FIG. 3B, the thickness of insulating layer 350 has been reduced to $t_2$. FIG. 3C represents the nominal endpoint of the etch, when the insulating layer 350 has been completely removed from conducting material 360.

Figure 4:
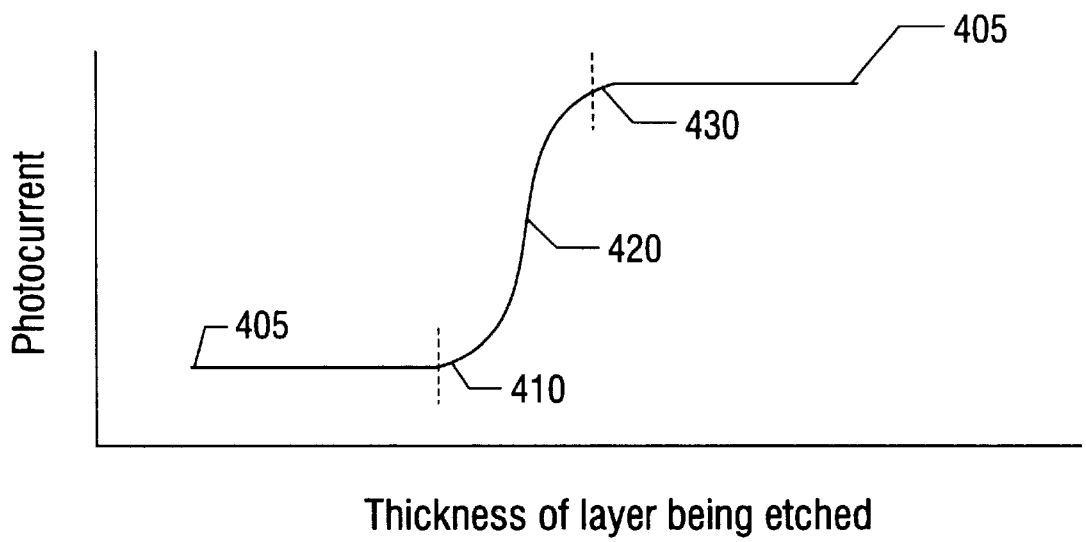
FIG. 4 is a schematic representation of the relative values of photocurrent emitted by the substrate of FIGS. 3A, 3B, and 3C at a series of different stages of removal of the layer of the insulating material.

FIG. 4 schematically shows a series of amplified photocurrent measurements 400 taken at successive times during the course of etching the substrate 100 shown in FIGS. 3A, 3B, and 3C in accordance with one embodiment of the invention. From the onset 405 of the amplified photocurrent measurements 400, up to a certain point 410, the amplified photocurrent is at a steady minimum level. This minimum level results from the layer of insulating material 350 being thick enough to completely inhibit photoemission from the underlying conductive material 360. In an intermediate region of the etching process, between the points designated with reference numerals 410 and 430 respectively, the decreasing thickness of insulating layer 350 gradually allows increasingly higher levels of photoemission. Within the intermediate region, the series of amplified photocurrent measurements 400 may exhibit an inflection point 420. At the end of the intermediate region 430, the photocurrent will reach a substantially steady maximum value. This maximum value is reached when insulating layer 350 no longer attenuates laser beam 810, and when the photoelectrons generated from conductive layer 360 can be emitted from substrate surface 110 without being obstructed by insulating layer 350.

Any of the three changes shown in FIG. 4—the increase in photocurrent 410, the inflection point 420, or the onset of steady state 430—might correspond to the endpoint of an etching process. For example, if the initial thickness $t_1$ of insulating layer 350 were exactly the same across the entire substrate surface 110, and if the etching process uniformly removed the insulating layer at all points across substrate surface 110, then the onset of steady state 430 may be the best indication of the endpoint. Typically, however, the layers subjected to an etching process do not have a uniform thickness at the onset of the etching process, and the etching process does not typically uniformly remove material across the entire surface of substrate 110. Thus, other changes in FIG. 4, such as increase 410, or inflection point 420, might be preferable indications of the endpoint. The change that most closely corresponds to the desired process endpoint for a particular etching process should be determined empirically.

Figure 5:
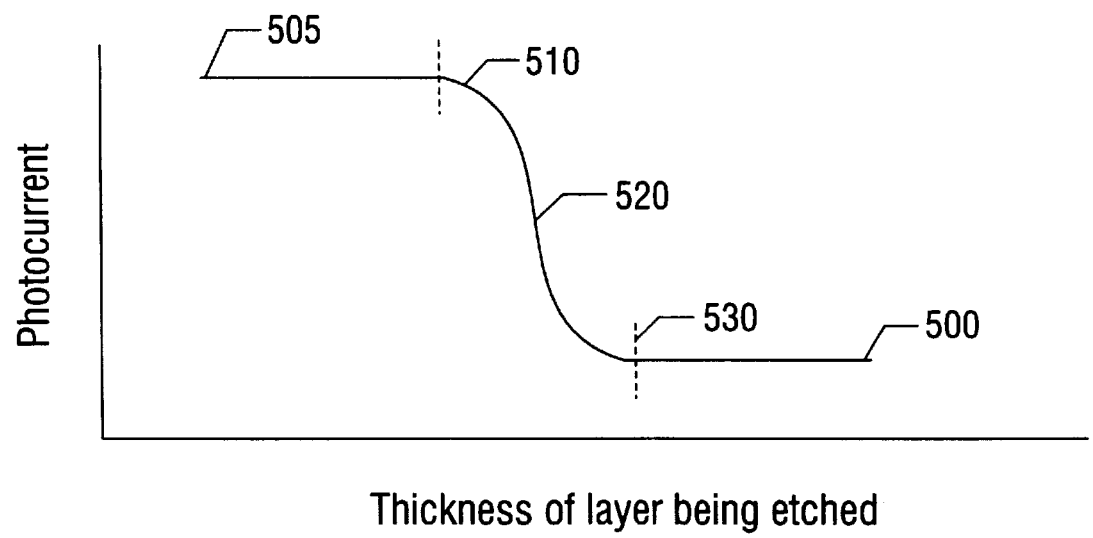
FIG. 5 is a schematic representation of the relative values of photocurrent emitted by a substrate comprising a layer of conductive material covering an insulating material at a series of different stages of removal of the layer of conductive material.

FIG. 5 schematically shows a series of amplified photocurrent measurements 500 taken at successive times during the course of an etching process in accordance with the presently disclosed embodiment of the invention in which a layer of conductive material is being removed from an underlying insulating material. From the onset 505 of the amplified photocurrent measurements 500, up to a certain point in the measurements 510, the amplified photocurrent is at a substantially steady maximum level. This maximum level is approximately equivalent to the photocurrent that would be produced by a bulk sample of the conductive material. After point 510, the amount of photoemitting material has been reduced enough so that the layer of conductive material no longer exhibits bulk properties. In an intermediate region of the etching process, between points 510 and 530, the photocurrent gradually decreases as more photoemitting material is removed. At the end of the intermediate region 530, the photocurrent reaches a steady minimum value. This minimum value is reached when all photoemitting material has been removed. Just as for FIG. 4, any of the three changes shown in FIG. 5—the increase in photocurrent 510, the inflection point 520, or the onset of steady state 530—might correspond to the desired endpoint of the etching process. The change that most closely corresponds to the desired process endpoint for a particular etching process should be determined empirically.

Figure 6:
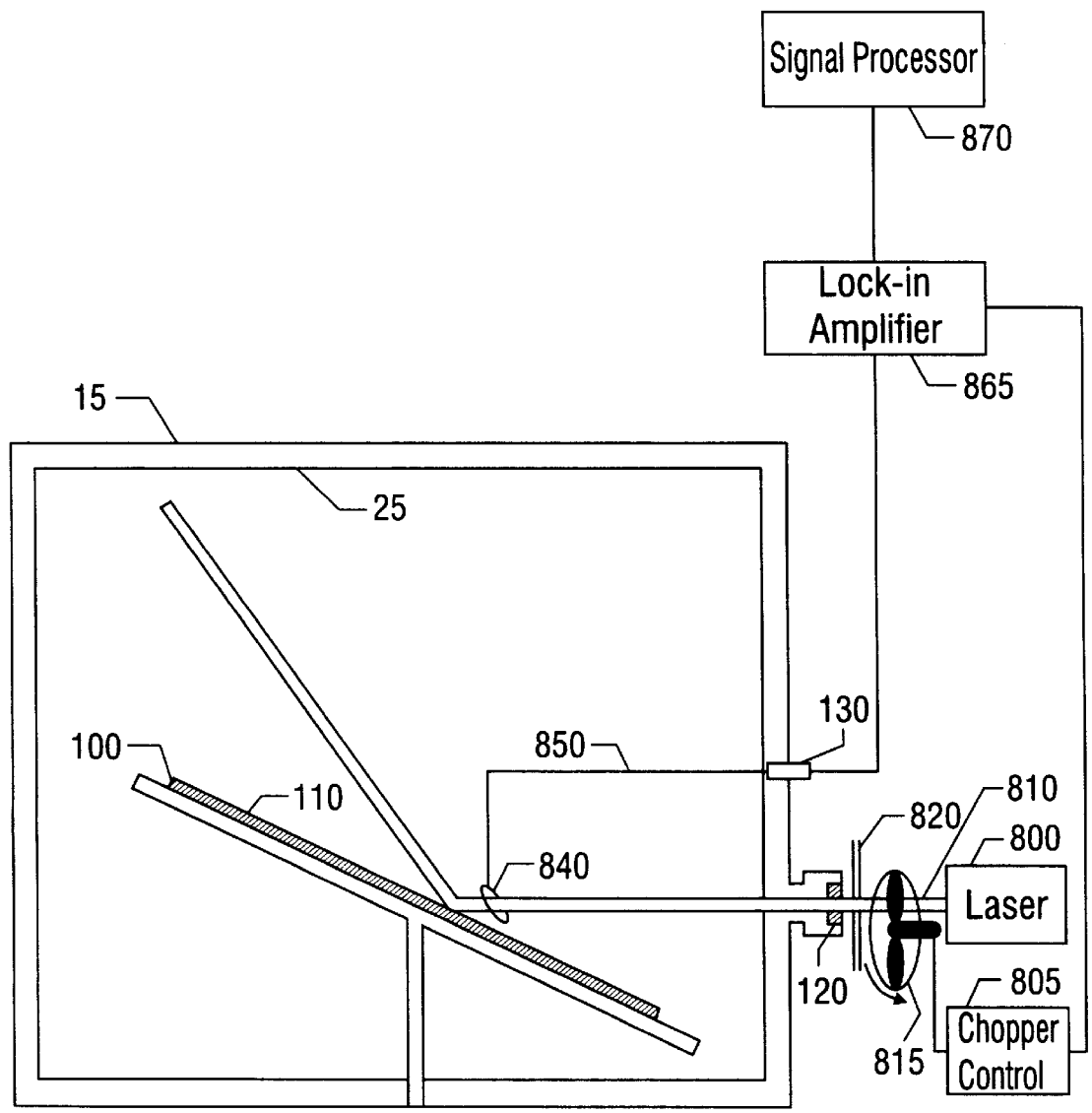
FIG. 6 is a schematic diagram of an implementation of an end point detection method that is in accordance with a second embodiment of the present invention.

FIG. 6 illustrates how an embodiment of the invention may be used to determine the endpoint of a plasma etching process. In a plasma etching process, material is removed from the surface 110 of substrate 100 by subjecting surface 110 to a reactive plasma 25. In a typical plasma etching system, the plasma is generated by an electric field oscillating at a predetermined frequency, e.g. a frequency of 13.56 Mhz. The plasma consists of free electrons and reactive ions.

The embodiment of the invention shown in FIG. 1 would not be able to determine the endpoint of a plasma etching process. The number of electrons generated by the plasma is much larger than the number of electrons generated by photoemission. Since collector 840 cannot differentiate between these two types of electrons, the presence of the plasma electrons creates a signal-to-noise problem. Lock-in amplifiers may be used to overcome this type of signal-to-noise problem. Lock-in amplifiers can use phase-sensitive detection to improve the signal-to-noise ratio. In the embodiment of FIG. 6, a chopper 815 modulates the laser beam at a reference frequency. A lock-in amplifier 865 then selectively amplifies the frequency component of the current from collector 840 corresponding to the reference frequency. Other components of the collected current, such as the component generated by the plasma electrons, are filtered out as long as they are not modulated at the reference frequency. Consequently, the reference frequency should not be at the predetermined frequency that generates the plasma (e.g., at 13.56 Mhz.) Except for the use of lock-in amplification, the embodiment of the invention shown in FIG. 6 is similar to the previously described embodiments.

The particular embodiments disclosed above are illustrative only, as the invention may be modified and practiced in different but equivalent manners as would be apparent to those skilled in the art having the benefit of the teachings herein. Furthermore, no limitations are intended as to the details of construction or design herein shown, other than as described in the claims below. It is therefore evident that the particular embodiments disclosed above may be altered or modified and all such variations are considered within the scope and spirit of the invention.

What is claimed is:

1. A method of determining the endpoint of a dry etch process when the dry etch process is acting on a substrate comprising a layer of a first material overlying a second material, said method comprising:
   (a) illuminating said substrate with a beam of light wherein said beam of light has a wavelength that corresponds to a photon energy that is greater than the work function of one of said first and second materials, and less than the work function of the other material, such that only one of said first and second materials photoemits;
   (b) collecting a photocurrent, said photocurrent consisting essentially of photoelectrons emitted by the one of said first and second materials which is photoemitting;
   (c) amplifying said photocurrent; and
   (d) monitoring a temporal series of amplified photocurrent measurements for a change in the amplified photocurrent measurements known to correspond to an endpoint of the dry etch process.

2. The method of claim 1, wherein said beam of light is generated by a laser.

3. The method of claim 2, wherein said laser is a continuous wave laser.

4. The method of claim 2, wherein said laser is a pulsed laser.

5. The method of claim 1, wherein said beam of light is generated by a mercury arc lamp.

6. The method of claim 1, wherein the photon energy of said beam of light is greater than the work function of said first material, and less than the work function of said second material.

7. The method of claim 6, wherein said first material comprises a conducting material and said second material comprises an insulating material.

8. The method of claim 7, wherein the photon energy of said beam of light is approximately 5 eV.

9. The method of claim 7, wherein said conductive material comprises a semiconductor.

10. The method of claim 7, wherein said conductive material comprises a metal.

11. The method of claim 7, wherein said insulating material comprises a polyimide.

12. The method of claim 7, wherein said insulating material comprises an oxide of a conductive material.

13. The method of claim 6, wherein the change in the temporal series of photocurrent measurements is selected from the group of a decrease in the amplified photocurrent measurement, an inflection point in the temporal series of amplified photocurrent measurements, and a leveling-off of the temporal series of amplified photocurrent measurements.

14. The method of claim 1, wherein the photon energy of said beam of light is less than the work function of said first material.

15. The method of claim 14, wherein said first material comprises an insulating material and said second material comprises a conducting material.

16. The method of claim 15, wherein the photon energy of said light is approximately 5 eV.

17. The method of claim 15, wherein the second material comprises a semiconductor.

18. The method of claim 15, wherein the second material comprises a metal.

19. The method of claim 15, wherein the first material comprises a polyimide.

20. The method of claim 15, wherein the first material comprises an oxide of a conductive material.

21. The method of claim 14, wherein the change in the temporal series of measurements is selected from the group of an increase in the amplified photocurrent measurement, an inflection point in the temporal series of amplified photocurrent measurements, and a leveling-off of the temporal series of amplified photocurrent measurements.

22. The method of claim 1, wherein said step (a) of illuminating the substrate further comprises:

(e) passing said beam of light through optical elements in order to direct, focus, or disperse the laser beam.

23. The method of claim 1, wherein said step (a) of illuminating the substrate further comprises (f) passing said beam of light through a chopper in order to modulate said light at a reference frequency;

and wherein said step (c) of amplifying the photocurrent further comprises:

(g) amplifying the frequency component of the photocurrent corresponding to said reference frequency.

* * * * *